United States Patent [19]
Mitchell

[11] Patent Number: 5,610,104
[45] Date of Patent: Mar. 11, 1997

[54] METHOD OF PROVIDING A MARK FOR IDENTIFICATION ON A SILICON SURFACE

[75] Inventor: Peter Mitchell, Bloomington, Minn.

[73] Assignee: Cypress Semiconductor Corporation, San Jose, Calif.

[21] Appl. No.: 664,252

[22] Filed: May 21, 1996

[51] Int. Cl.$^6$ .................................. H01L 21/465
[52] U.S. Cl. .................. 437/228; 148/DIG. 50; 148/33.3; 156/644.1; 156/662.1; 437/239
[58] Field of Search .................. 437/228, 239, 437/985; 148/DIG. 50, 33.3; 156/644.1, 662.1

[56] References Cited

U.S. PATENT DOCUMENTS 5,237,343  8/1993  Osada .................... 346/140 R

OTHER PUBLICATIONS

French, William B. "Technique for reducing surface leakage and surface breakdown in semiconductor devices", Technical Notes No. 919. Publication of RCA, Princeton, NJ Oct. 25, 1972.

Primary Examiner—Robert Kunemund
Assistant Examiner—Vanessa Acosta
Attorney, Agent, or Firm—Barnes, Kisselle, Raisch, Choate, Whittemore & Hulbert, P.C.

[57] ABSTRACT

The present invention concerns a method for making an identification mark on a silicon surface. In a preferred embodiment, the identification mark formed on the silicon surface does not substantially score the silicon. A silicon or silicon dioxide surface coated with an insulating layer is marked by laser scribing, leaving an exposed area on the silicon or the silicon dioxide. The exposed area on the silicon wafer is preferably not marked by the laser scribing. The exposed silicon surface is then oxidized by dry or wet oxidizing. The silicon oxide can be subsequently removed to leave an etched mark. The method reduces or eliminates the formation of stresses and silicon slag at the etched mark that can cause defects and reduce yield.

19 Claims, 1 Drawing Sheet

METHOD OF PROVIDING A MARK FOR IDENTIFICATION ON A SILICON SURFACE

FIELD OF THE INVENTION

The present invention generally relates to a method of providing identification marks on a silicon surface and more particularly, to a method of using a laser to scribe through an insulating layer deposited on a silicon surface and then oxidizing the exposed silicon by an oxidation process to provide identification marks on the silicon surface.

BACKGROUND OF THE INVENTION

In the semiconductor fabrication industry, marks or numbers on surfaces of silicon wafers may be provided for identification purpose. These identification marks or numbers are used to track different lots of silicon wafers that are manufactured. The tracking marks or numbers can be used, for example, to call back a suspected defective lot where there may be a quality issue or discrepancy. Additionally, the identification marks or numbers can be used to indicate different characteristics of the silicon wafers.

One approach for providing identification marks or numbers on a silicon wafer uses a laser scribing technique to directly cut the identification marks or numbers into the silicon layer. In a typical semiconductor fabrication process where a silicon wafer is coated with an insulating layer, the identification technique includes the step of laser scribing through the insulating layer into the silicon. The insulating layer frequently is silicon nitride deposited onto silicon dioxide, or any other non-oxidizing insulating materials.

FIG. 1 is a cross-sectional view of a silicon wafer 10 having a laser scribe mark 12. The product of direct laser scribing, silicon wafer 10, is shown. The silicon wafer 10 comprises the laser scribe mark 12 which has a first side wall 14, a second side wall 16 and a bottom wall 18 which defines an etched area 20. The etched area 20 occupies a volume that is defined by the width of the bottom wall 18 times the height of either the first side wall 14 or the second side wall 16 times the length (not shown) of the mark made in the silicon wafer 10. The volume defined by the etched area 20 also represents an amount of silicon that is removed from the silicon wafer 10. The silicon is removed by a laser scribe machine (not shown) or other cutting or burning tools. The removal by the laser scribe of a predetermined amount of silicon material creates a "silicon slag" (i.e., silicon particles or dust). The silicon slag generated is excess material that can contaminate the wafer and its surrounding environment and thus adversely affect the fabrication process, in the later steps when the slag is washed out of the mark in a wet chemical etch process.

It is desirable to reduce or eliminate the amount of silicon slag generated. Silicon slag has similar electrical and other physical characteristics as the underlying silicon wafer 10. Additionally, the etched area 20 can create stresses which can cause defects in the silicon wafer 10. The defects in turn reduce the yield of the fabrication process. It is thus advantageous to reduce stresses created in the silicon wafer near the etched area 20.

OBJECTS OF THE PRESENT INVENTION

It is therefore an object of the present invention to provide a method of making an identification mark on a silicon surface that substantially reduces or eliminates silicon slag.

It is another object of the present invention to provide a method of making an identification mark on a silicon surface that substantially reduces or eliminates stresses in the silicon.

It is a further object of the present invention to provide a process of making an identification mark on a silicon wafer that reduces sources of electrical disturbance in the silicon wafer.

It is still another object of the present invention to provide a method of making an identification mark on a silicon wafer that minimizes exposure of the silicon wafer to particle or dust contamination.

It is yet another object of the present invention to provide an identified and/or marked article having a silicon surface (e.g., a silicon wafer) with minimal silicon slag thereon and/or stresses therein.

SUMMARY OF THE INVENTION

The present invention provides (1) a method for making an identification mark on a silicon surface and (2) an article having a marked silicon surface. The present process does not substantially score the silicon itself. The silicon surface may be the surface of a silicon wafer, and may contain one or more further layers thereon.

In the present process, the silicon surface to be marked may be oxidized and/or coated with an insulating layer. The insulating layer is then marked by laser scribing, leaving an exposed silicon surface or exposed silicon dioxide surface. The silicon surface itself is not significantly scribed or damaged in the exposed area. Any exposed silicon surface is then oxidized. The oxidized silicon or exposed silicon dioxide is then removed. The present invention method greatly reduces or eliminates (a) particle contamination of the silicon surface and (b) stresses created in the surface of wafer, both of which are likely to cause defects and reduce yield.

BRIEF DESCRIPTION OF THE DRAWINGS

These and other objects, features and advantages of the present invention will be apparent from the following detailed description and the appended drawings in which.

DETAILED DESCRIPTION OF THE PREFERRED EMBODIMENTS

Figure 1:
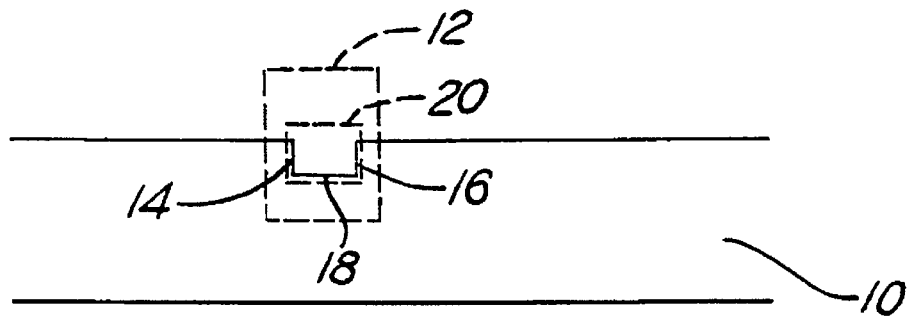
FIG. 1 is a cross-sectional view of an identification mark scribed directly onto a silicon wafer.
Figure 2:
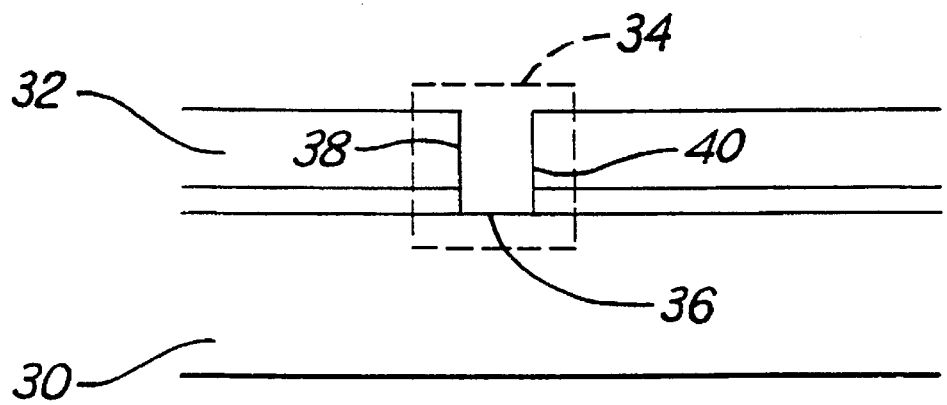
FIG. 2 is a cross-sectional view of a silicon surface prepared by a preferred embodiment of the present invention prior to oxidation.

FIG. 2 shows a cross-sectional view of a silicon surface prepared by a preferred embodiment of the present invention. FIG. 2 shows a silicon wafer 30, an insulating layer 32 and a laser scribe mark 34. The insulating layer 32 generally comprises a material such as silicon nitride, silicon oxynitride or silicon oxide. The laser scribe mark 34 comprises a bottom wall 36, a first side wall 38 and a second side wall 40.

The laser scribe mark 34 may be limited to a volume in which only the insulating layer 32 has been cut through. The laser scribe mark 34 preferably does not substantially penctrate the surface of the silicon wafer 30. By not significantly or not substantially penetrate into the surface of the silicon wafer, it is meant that a depth of less than 2000 Å is penetrated into the surface. When the laser beam does not contact the silicon wafer 30, no extraneous silicon particles are generated which may contaminate the silicon wafer 30 during further processing. Additionally, since the laser scribe mark 34 does not substantially cut into the silicon wafer 30, mechanical stresses in the silicon wafer 30 are minimized. The identification marks or numbers on the silicon wafer 30 are intended primarily for identification purposes, rather than for electrical or mechanical effects. Therefore, one of the benefits achieved by the present invention is reducing or eliminating mechanical stresses and/or electrical deviations which may be created by directly scribing the identification numbers into the silicon surface.

Figure 3:
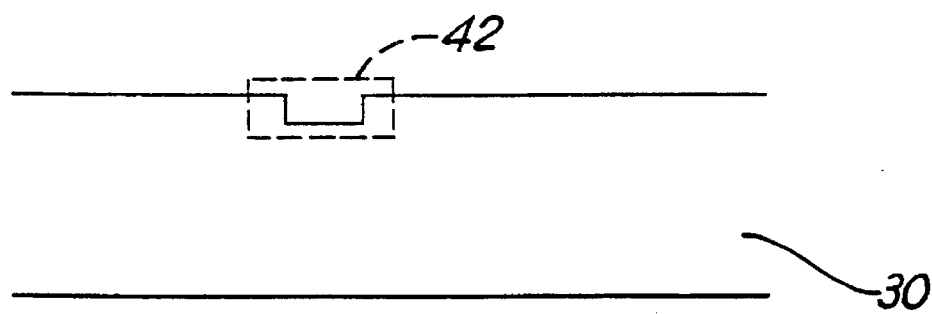
FIG. 3 is a cross-sectional view of the silicon surface prepared by a preferred embodiment of the present invention after oxidation.

Referring now to FIG. 3, a cross-sectional view of the silicon wafer 30 is shown after an oxidation process is performed. Typically, oxidation can be carried out by either a dry oxidation process or a wet oxidation process. Dry oxidation, also known as atmospheric oxidation, is performed by oxidizing a wafer in dry oxygen at an elevated temperature so that silicon on and/or near the surface is converted into silicon dioxide. The dry oxidation temperature may be at least about 800° C., more preferably at least about 1000° C. Dry oxidation can be conducted, for example, in a resistance-heated furnace or in a rapid-thermal processing chamber. The dry oxygen is frequently mixed with an inert carrier gas such as nitrogen and then passed over a silicon wafer at the elevated temperature. The exposure time may be sufficient to dry oxidize the silicon surface (for example, at least about 2 hours, preferably from about 2 to about 10 hours). The dry oxygen may enter the furnace at a flow rate sufficient to oxidize the silicon surface (for example, about 5400 sccm).

A wet oxidation process may be performed by bubbling oxygen through a water bath maintained at a temperature of at least about 50° C., preferably from 70° to 100° C., more preferably approximately 90° C. The temperature of the water bath determines the partial pressure of water in the oxygen gas stream. The oxygen/water vapor mixture is passed over a silicon wafer at an elevated temperature of at least about 800° C., preferably at least about 1000° C. Wet oxidation can also be carried out by directly reacting hydrogen with oxygen. For instance, hydrogen gas and oxygen gas may be reacted by igniting with a torch. The formed water vapor may then be transferred into a furnace. The exposure time for proper silicon oxide formation by wet oxidation may be that which is sufficient to form a layer of silicon oxide from the surface silicon, for example between about 50 and about 200 minutes. The oxygen and hydrogen are transferred to the torch at, for example, flow rates of about 3200 sccm and about 5700 sccm, respectively.

The oxide formed, either by dry oxidation or wet oxidation, can be removed by dissolving with hydrofluoric acid or other suitable acid. As a result, an oxidation mark 42 is created.

In a further embodiment of the present invention, oxidizing silicon and removing formed oxide can be carried out simultaneously, preferably in a nitric-hydrofluoric acid mixture (for instance, where the volume or weight ratio of $HNO_3$ to HF is from 45% to 70%). Nitric acid reacts with surface silicon to form a layer of silicon oxide on the silicon surface. The silicon oxide is then dissolved away by the hydrofluoric acid. An etched mark is thus formed in the surface of the silicon wafer. A variety of nitric acid/hydrofluoric acid etchants can be used, depending on the ratio of the etch components. The etchants may also contain water or acetic acid as a diluent. A lower etch rate is normally obtained with a nitric acid-rich etchant. This appears to indicate that the rate-limiting reaction is the removal of the oxide by the relatively small percentage of HF in the etchant mixture. It has been found that the more equal the ratio of $HNO_3$ to HF, the more balanced the function of each component (i.e., nitric acid to form the oxide and hydrofluoric acid to dissolve it away), and the more efficient the simultaneous oxidizing and removing steps.

The laser equipment to be used in the scribing process can be of any one of commercially available lasers. For instance, a continuous YAG laser of 1–2 W power can be used at a scanning rate of 1000–2000 mil/sec. in an engraving mode; or at a pulse rate of 700–2000 Hz in a dot matrix mode. The laser power can be adjusted so that when it is used in scribing the insulating layer, it does not cut into the silicon surface. It may be adjusted to stop in the oxide layer separating the silicon surface and the nitride.

The present method for providing an identification mark or number on a silicon wafer minimizes negative electrical and/or mechanical inconsistencies into the silicon surface. The identification number can later be used to determine and possibly locate specific lots of the silicon wafer for post production quality control. Additionally, a look-back system can be implemented where a problem with a particular silicon wafer can be later tracked to other potentially defective parts. This would reduce or eliminate some quality control issues for potentially functionally unrelated silicon devices manufactured from the particular silicon wafer.

While the present invention has been described in an illustrative manner, it should be understood that the terminology used is intended to be in a nature of words of description rather than of limitation.

Furthermore, while the present invention has been described in terms of preferred embodiments, those skilled in the art can readily apply these teachings to other variations of the invention.

I claim:

1. A method for providing a mark on a silicon surface comprising the steps of:

removing a section of an insulating layer on said silicon surface to expose said silicon surface, said section resembling said mark, and oxidizing said exposed silicon surface to form an oxidation product.

2. A method according to claim 1 further comprising the step of removing said oxidation product.

3. A method according to claim 1, wherein said section of the insulating layer is removed in a manner that is substantially stress-free to said silicon surface.

4. A method according to claim 1, wherein said insulating layer comprises at least one material selected from the group consisting of silicon nitride, silicon oxynitride and silicon oxide.

5. A method according to claim 1, wherein said oxidizing step comprises dry oxidation.

6. A method according to claim 1, wherein said oxidizing step comprises wet oxidation.

7. A method according to claim 5, wherein said oxidizing step comprises contacting said exposed silicon surface with dry oxygen at a temperature of not less than about 800° C.

8. A method according to claim 6, wherein said oxidizing step comprises contacting said surface with water vapor at a temperature of not less than about 800° C.

9. A silicon surface having a mark thereon prepared by the method of claim 1.

10. A method for providing a mark on a silicon wafer comprising the steps of:

(A) scribing a mark through an insulating layer on the surface of said silicon wafer to expose said silicon surface;

(B) oxidizing said exposed silicon surface to form an oxidation product; and (C) removing said oxidation product.

11. A method according to claim 10, wherein said step (A) substantially avoids scribing the surface of said silicon wafer.

12. A method according to claim 10, wherein said insulating layer comprises at least one material selected from the group consisting of silicon nitride, silicon oxynitride and silicon oxide.

13. A method according to claim 10, wherein said step (B) comprises contacting said exposed silicon surface with an oxidizing agent.

14. A method according to claim 10, wherein said step (B) comprises wet oxidation.

15. The method according to claim 10, wherein said step (B) comprises dry oxidation.

16. A method according to claim 10, wherein said scribing comprises irradiating with a laser.

17. A silicon wafer having a mark thereon prepared by the method of claim 10.

18. A structure comprising the silicon surface of claim 9.

19. A silicon wafer comprising a wafer body and a wafer surface, said wafer surface having a mark thereon formed by the method of claim 1.

* * * * *